(12) United States Patent
Mäntymäki et al.

(10) Patent No.: US 9,382,615 B2
(45) Date of Patent: Jul. 5, 2016

(54) VAPOR DEPOSITION OF LIF THIN FILMS

(71) Applicant: ASM IP HOLDING B.V., Almere (NL)

(72) Inventors: Miia Mäntymäki, Helsinki (FI); Jani Hämäläinen, Espoo (FI); Mikko Ritala, Espoo (FI); Markku Leskelä, Espoo (FI)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 13/802,382

(22) Filed: Mar. 13, 2013

(65) Prior Publication Data

US 2014/0106070 A1 Apr. 17, 2014

Related U.S. Application Data

(60) Provisional application No. 61/713,340, filed on Oct. 12, 2012.

(51) Int. Cl.
| | | |
|---|---|---|
| C23C 16/08 | (2006.01) | |
| C23C 16/30 | (2006.01) | |
| C23C 16/455 | (2006.01) | |

(52) U.S. Cl.
CPC .............. C23C 16/08 (2013.01); C23C 16/30 (2013.01); C23C 16/45534 (2013.01)

(58) Field of Classification Search
CPC .. C23C 16/08; C23C 16/30; C23C 16/45525; C23C 16/45553
USPC ......................................... 427/255.29, 255.39
See application file for complete search history.

(56) References Cited

U.S. PATENT DOCUMENTS

| | | | | |
|---|---|---|---|---|
| 7,584,662 | B2 * | 9/2009 | Suzuki ........................ | 73/514.32 |
| 2002/0109456 | A1 * | 8/2002 | Morii et al. .................... | 313/504 |
| 2003/0165615 | A1 * | 9/2003 | Aaltonen et al. ................ | 427/79 |
| 2005/0104510 | A1 * | 5/2005 | Parthasarathy et al. ....... | 313/504 |
| 2005/0127421 | A1 * | 6/2005 | Seidl et al. ..................... | 257/300 |
| 2006/0269656 | A1 * | 11/2006 | Boroson et al. ................. | 427/66 |
| 2007/0292957 | A1 * | 12/2007 | Chua et al. ....................... | 436/5 |
| 2008/0284320 | A1 * | 11/2008 | Karkkainen ................... | 313/504 |
| 2009/0274930 | A1 * | 11/2009 | Remington, Jr. .............. | 428/689 |
| 2011/0099798 | A1 | 5/2011 | Nilsen et al. | |
| 2012/0060910 | A1 * | 3/2012 | Schoenfeld et al. .......... | 136/256 |
| 2012/0171359 | A1 * | 7/2012 | Nakai et al. ..................... | 427/66 |
| 2014/0113197 | A1 * | 4/2014 | Xiao et al. ..................... | 429/223 |
| 2014/0234715 | A1 * | 8/2014 | Fasching .................. | H01M 4/04 429/220 |

OTHER PUBLICATIONS

Pilvi, Tero, et al., "Atomic layer deposition process with TiF4 as a precursor for depositing metal fluoride thin films". Applied Optics, May 1, 2008, vol. 47, No. 13, pp. C271-C274.*
Binions, Russell, et al., "Aerosol-assisted chemical vapour deposition of sodium fluoride thin films". Thin Solid Films 469-470 (2004 416-419.*
Tsang, W.S., et al., "Epitaxial lithium fluoride films grown by pulsed laser deposition." Appl. Phys. A 77, 693-696 (2003).*
Kumar, M., et al., "Swift heavy ion induced structural and optical modifications in LiF thin film". J. Phys. D: Appl. Phys. 38 (2005) 637-641.*
Mantymaki, Miia, et al., "Atomic Layer Deposition of LiF Thin Films from Lithd and TiF4 precursors". Chem. Vap. Deposition 2013, 19, 111-116.*
Putkonen, Matti, et al., "Atomic layer deposition of lithium containing thin films." Journal of Materials Chemistry, 2009, 19, 8767-8771.*
Tanaka, Akira, et al., "Preparation of lithium niobate films by metalorganic chemical vapor deposition with a lithium alkoxide source." Journal of Crystal Growth 148, (1995), 324-326.*
Mantymaki, Miia, et al., "Atomic Layer Deposition of LiF Thin Films from Lithd and TiF4 Precursors". Chemical Vapor Deposition, 2013, 19, 111-116.*
Mazur, Piotr, et al., "Thermal stability of LiF thin films on 6H—SiC(0001) surface". Vacuum 84, (2010) 622-624.*
Jiang, C.B., et al., "Lithium Fluoride nanowires via vapor-liquid-solid growth". Applied Physics Letters 88, 093103 (2006), pp. 1-3.*
Lapiano-Smith, D.A., et al., "Epitaxy of LiF on Ge(100)". Applied Physics Letters 59, Oct. 17, 21, 1991, pp. 2174-2176.*
Almaviva, S., et al., "Hard x-ray contact microscopy with 250 nm spatial resolution using a LiF film detector and a tabletop microsource". Applied Physics Letters 89, 054102 (2006), pp. 1-3.*
Ylilammi, M., et al., "Metal Fluoride Thin Films Prepared by Atomic Layer Deposition". J. Electrochem. Soc., vol. 141, No. 5, May 1994, pp. 1278-1284.*

* cited by examiner

*Primary Examiner* — Bret Chen
(74) *Attorney, Agent, or Firm* — Knobbe Martens Olson & Bear LLP

(57) ABSTRACT

A vapor deposition process for forming a thin film on a substrate in a reaction chamber where the process includes contacting the substrate with a fluoride precursor. The process results in the formation of a lithium fluoride thin film.

16 Claims, 11 Drawing Sheets

VAPOR DEPOSITION OF LIF THIN FILMS

CROSS-REFERENCE TO RELATED APPLICATIONS

This application claims the benefit of U.S. Provisional Patent Application Ser. No. 61/713,340, filed Oct. 12, 2012, entitled "ATOMIC LAYER DEPOSITION OF LiF THIN FILMS." The priority application is incorporated herein by reference in its entirety.

BACKGROUND OF THE INVENTION

1. Field

The application relates to vapor deposition methods including, but not limited to, atomic layer deposition and chemical vapor deposition processes for forming lithium fluoride films.

2. Description of the Related Art

Lithium fluoride ("LiF") is an interesting optical material with a large band gap—about 14 eV—and low refractive index—about 1.39 at 580 nm. These attributes make it a good window material in the ultraviolet region of electromagnetic radiation. LiF is sensitive to both high-energy electromagnetic radiation, such as X-rays and gamma rays, and low-energy electrons and ions, easily forming color centers. Because of this sensitivity, it can be utilized in imaging detectors and dosimetry. Additionally, LiF could be useful as a starting material for solid lithium ion conducting electrolyte materials when combined with transition metal fluorides.

LiF is commonly deposited by a number of different physical methods, including thermal evaporation and sputtering. In general, however, films deposited by these physical methods do not show good conformality.

SUMMARY

According to some aspects of the present disclosure, vapor deposition can be used to form thin films comprising LiF. In some embodiments atomic layer deposition ("ALD") processes are used. In other embodiments chemical vapor deposition ("CVD") processes are used. In some embodiments, physical vapor deposition ("PVD") processes are not used.

In some embodiments vapor deposition processes for forming a lithium fluoride thin film on a substrate in a reaction chamber comprise contacting the substrate with a lithium precursor and contacting the substrate with a fluoride precursor. The lithium and fluoride precursors react on the substrate surface to form a lithium fluoride film.

In some embodiments, the lithium precursor comprises at least one of lithium 2,2,6,6-tetramethyl-3,5-heptanedionate (Lithd), lithium tert-butoxide, lithium hexafluoroacetylacetonate or lithium hexamethyldisilazane. In some embodiments the fluoride precursor comprises at least one of $TiF_4$, $TaF_5$, $WF_6$, $MoF_x$, $F_2$, HF, hexafluoroacetylacetone, or a metal hexafluoroacetylacetonate. In some embodiments, the lithium precursor is 2,2,6,6,-tetramethyl-3,5-heptanedionato lithium ("Lithd") and, in some embodiments, the fluoride precursor is titanium (IV) fluoride ("$TiF_4$"). In some embodiments the LiF films are deposited at temperatures ranging from about 80° C. to about 800° C.

In some embodiments an ALD process for forming a lithium fluoride film comprises contacting the substrate with a vapor phase lithium precursor, purging the reaction chamber, contacting the substrate with a vapor phase fluoride precursor and purging the reaction chamber. The process may be repeated until a thin film of the desired thickness is formed. In some embodiments the ALD process additionally comprises contacting the substrate with an intermediate precursor, such as a magnesium precursor or a calcium precursor. The intermediate precursor may be, for example, $Mg(thd)_2$.

In some embodiments, a vapor deposition process for forming a lithium fluoride thin film comprises forming an intermediate material and converting that intermediate material to lithium fluoride. For example, in some embodiments a magnesium fluoride film is deposited and contacted with a lithium precursor such that the magnesium in the magnesium fluoride film is replaced with lithium, thereby forming a lithium fluoride film.

In some embodiments an ALD process for forming a lithium fluoride film utilizes an intermediate precursor. The substrate is alternately and sequentially contacted with an intermediate precursor, a fluoride precursor and a lithium precursor. In some embodiments the lithium precursor is provided in every ALD cycle, while in other embodiments the lithium precursor is provided intermittently in the deposition process or at the end of the deposition process. The intermediate precursor may comprise, for example, magnesium. In some embodiments the intermediate precursor is $Mg(thd)_2$.

In some embodiments a chemical vapor deposition process for forming a lithium fluoride film on a substrate comprises simultaneously contacting a heated substrate with a lithium precursor and a fluoride precursor. In some embodiments the lithium precursor and the fluoride precursor are provided separately, in at least partially overlapping pulses.

In contrast to prior art methods, the use of vapor deposition processes, such as ALD or CVD, to create LiF thin films results in good conformality. In addition, ALD provides for tuning the film thickness by changing the number of cycles used in the deposition. Such control is particularly beneficial when depositing very thin films for applications such as organic LEDs, organic plastic solar cells, thin-film batteries, and 3D batteries.

BRIEF DESCRIPTION OF THE DRAWINGS

The invention will be better understood from the Detailed Description and from the appended drawings, which are meant to illustrate and not to limit the invention, and wherein.

DETAILED DESCRIPTION

Figure 1:
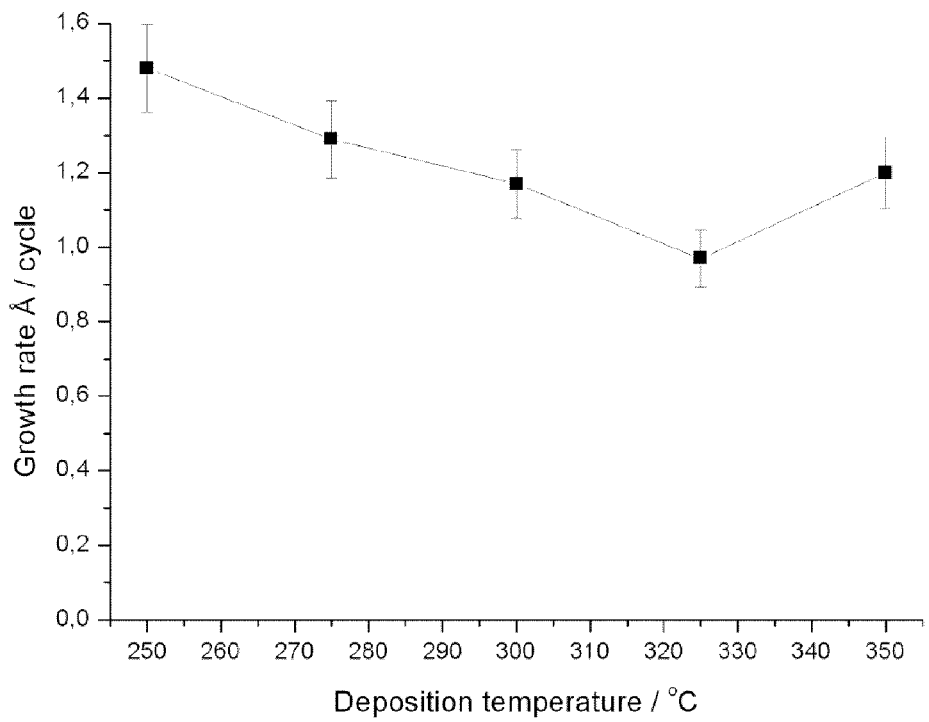
FIG. 1 illustrates the growth rate of LiF thin films as a function of deposition temperature according to some embodiments.

In one aspect, methods of depositing LiF thin films by vapor deposition, such as atomic layer deposition and chemical vapor deposition, are provided.

In some embodiments a LiF thin film is formed on a substrate by an atomic layer deposition process comprising alternately and sequentially contacting a substrate, such as $SiO_2$, in a reaction space with a vapor phase lithium precursor and a fluoride reactant. In a first reactant pulse of the Li precursor, up to a monolayer of the lithium precursor forms on the substrate surface, preferably in a self-limiting manner. In a subsequent pulse, the fluoride-containing reactant reacts with the chemisorbed lithium precursor to form a LiF thin film.

In some embodiments, an ALD process is used in which two or more precursor materials are alternately and sequentially contacted with a substrate by pulsing the vapor phase precursors through a reactor. A purge gas may be supplied between each precursor application to remove excess reactant and reaction by-products, if any. In some embodiments, two precursors are used. In some embodiments, more than two precursors are used. In some embodiments in which more than two precursors are used, an intermediate material may be formed on the substrate prior to forming the LiF thin film.

In some embodiments in which only two precursors are used, in each ALD cycle a substrate is alternately and sequentially contacted with a vapor-phase lithium precursor and a vapor-phase fluoride precursor. The deposition cycle may begin with a pulse of either reactant. For example, the lithium precursor may be provided first to the reaction space where it contacts the substrate and forms up to a monolayer. After excess lithium precursor is removed, a vapor phase fluoride precursor is provided to the reaction space where it reacts with the lithium precursor on the substrate surface. Alternatively, the fluoride precursor may be provided first. After the application of each precursor, excess reactant is removed from the vicinity of the substrate. For example, in some embodiments a purge gas is used to remove excess precursor materials and reaction by-products that may be present in the reactor. The purge gas may be, for example, an inert gas. In some embodiments the excess reactant is removed from the vicinity of the substrate by physically moving the substrate itself.

In some embodiments an ALD process comprises a plurality of deposition cycles comprising:
contacting the substrate with a vapor phase lithium precursor, such that at most a molecular monolayer of the lithium precursor is formed on the substrate surface,
removing excess lithium precursor,
contacting the substrate with a vapor phase fluoride precursor, wherein the fluoride precursor reacts with the lithium precursor on the substrate surface to form LiF; and
removing excess fluoride precursor.

The deposition cycle can be repeated until a lithium fluoride thin film of a desired thickness has been formed.

The ALD cycle is repeated until a thin LiF film of a desired thickness has been achieved on the substrate. In some embodiments, this cycle can be repeated as many as or more than 500, 750, or 1000 times. In some embodiments, the cycle is repeated to achieve a thin film having a thickness up to or more than 100 nm.

The ALD process is carried out at a deposition temperature below the thermal decomposition temperature of the reactants. In some embodiments, the ALD process is carried out at a deposition temperature of about 80° C. to about 800° C., about 100° C. to about 400° C., and more preferably about 250 to about 350° C. Temperatures above about 350° C. may be used in some embodiments.

In some embodiments, it is desirable to keep the temperature below about 375° C., as Lithd may decompose at about this temperature. In some embodiments, temperatures higher than 375° C. may be used depending on the particular precursors that are used.

Vapor phase pulses of reactants may be from about 1 to about 10 seconds or more, typically about 2-3 seconds. In some embodiments the pulse time for the lithium precursor and/or the fluoride precursor is about 0.05 to 180 seconds, 0.1 to 50 seconds, 1 to 10 seconds or about 2 seconds. Depending on the reactor type, substrate type and its surface area, the pulsing time for the lithium precursor and fluoride precursor may be even higher than 180 seconds. In some embodiments, pulsing times can be on the order of minutes. The optimum pulsing time can be readily determined by the skilled artisan based on the particular circumstances.

In some embodiments, more than two precursors are used in one or more ALD cycles. Again, each precursor is provided separately in the vapor phase and a excess precursor is removed between each reactant pulse, for example by providing a purge gas. In some embodiments an intermediate material is formed on the substrate prior to the formation of the desired LiF. In some embodiments, the intermediate material is $MgF_2$. Thus, in some embodiments in each ALD cycle the substrate is alternately and sequentially contacted with a fluoride precursor, an intermediate precursor, such as a magnesium precursor, and a lithium precursor. For example a Mg precursor may be provided to the reaction chamber where it adsorbs on the substrate surface. After removing excess Mg precursor, a second pulse of a fluoride precursor is provided. The fluoride precursor reacts with the Mg precursor to form a magnesium fluoride intermediate. A Li precursor is then provided and reacts with the magnesium fluoride to form lithium fluoride, such as by replacing the Mg in the magnesium fluoride.

In some embodiments an ALD process comprises a plurality of deposition cycles comprising:

contacting the substrate with a vapor phase intermediate precursor, such that at most a molecular monolayer of the intermediate precursor is formed on the substrate surface, removing excess intermediate precursor, such as by purging, contacting the substrate with a vapor phase fluoride precursor, wherein the fluoride precursor reacts with the intermediate precursor on the substrate surface to form an intermediate fluoride; and removing excess fluoride precursor, such as by purging, contacting the substrate with a vapor phase lithium precursor, such that at most a molecular monolayer of lithium fluoride is formed on the substrate surface, removing excess lithium precursor, such as by purging, The deposition cycle can be repeated until a lithium fluoride thin film of a desired thickness has been formed.

In some embodiments the intermediate precursor may be a calcium precursor or a magnesium precursor.

According to some embodiments, the use of an intermediate may reduce the amount of a lithium precursor required, such as Lithd, and/or may at least somewhat reduce the dependency of the film growth rate on temperature.

In some embodiments the intermediate precursor (and thus the intermediate material) comprise magnesium. In some embodiments, a Mg intermediate precursor is reacted with a fluoride precursor to produce a magnesium fluoride intermediate material prior to providing the lithium precursor. Therefore, some embodiments, may achieve superior film growth by sequentially pulsing a precursor material, such as $Mg(thd)_2$, a fluoride precursor, such as $TiF_4$, and a lithium precursor, such as Lithd. Some embodiments using this method will produce pure, crystalline LiF with no $MgF_2$ impurities detectable at a deposition temperature above 300° C.

In some embodiments $Mg(thd)_2$ is provided as the first reactant. The substrate is subsequently contacted with a fluoride precursor, such as $TiF_4$, thereby forming a $MgF_2$ intermediate. Once the $MgF_2$ intermediate has been achieved, a lithium precursor such as Lithd is pulsed through the reactor. The lithium in the Lithd then replaces the magnesium in the intermediate layer resulting in a LiF layer, such as a LiF monolayer or less and, in some cases, more than a monolayer.

In some embodiments, an ALD process for depositing LiF using an intermediate may be performed at about 275° C. to about 350° C.

In some embodiments, the pulse length of each precursor can be between about 0.3 seconds and about 5 seconds and can occur at a pressure of about 3 mbar to about 7 mbar. The purge periods in some embodiments range from about 0.5 seconds to about 4 seconds and can be from about 1 second to about 2 seconds. In some embodiments, the pulse length of the intermediate precursor is the longest of the three pulses with the lithium precursor being longer than the fluoride precursor. In some embodiments, the intermediate precursor pulse length is between about 2 seconds and about 5 seconds, the lithium precursor pulse length is between about 0.4 seconds and about 5 seconds, and the fluoride precursor pulse length is between about 0.4 seconds and about 3 seconds. In some embodiments, the intermediate precursor pulse length is between about 3 seconds and about 4 seconds, the lithium precursor pulse length is between about 0.5 seconds and about 4 seconds, and the fluoride precursor pulse length is between about 0.5 seconds and about 2 seconds.

In some embodiments employing an intermediate material, the film growth rate may be between about 1.1 Å/cycle and about 1.7 Å/cycle.

In some embodiments the Li precursor is provided in every ALD cycle as described above. However, in other embodiments the Li precursor may be supplied intermittently, for example every 2, 3, 4, 5, 10 or more cycles. That is, some ALD cycles may comprise alternately and sequentially contacting the substrate with an intermediate precursor, such as a magnesium precursor, and a fluoride precursor. A lithium precursor is provided intermittently in one or more of the deposition cycles.

Thus, in some embodiments an ALD process comprises a plurality of deposition super-cycles comprising:

a first sub-cycle comprising:

contacting the substrate with a vapor phase intermediate precursor, such that at most a molecular monolayer of the intermediate precursor is formed on the substrate surface, removing excess intermediate precursor, contacting the substrate with a vapor phase fluoride precursor, wherein the fluoride precursor reacts with the intermediate precursor on the substrate surface to form an intermediate fluoride; and removing excess fluoride precursor.

The deposition sub-cycle may be repeated a predetermined number of times to form an intermediate layer of a desired thickness. The substrate is then contacted with a pulse of a vapor phase lithium precursor, such that a layer of lithium fluoride is formed on the substrate surface, thereby completing the super-cycle. The super-cycle can be repeated one or more times to achieve a lithium fluoride film of a desired thickness.

The order of provision of the reactants may be varied. Thus, in some embodiments, the intermediate precursor, such as a magnesium precursor, for example $Mg(thd)_2$, may be pulsed through the reactor either before or after the fluoride precursor, for example $TiF_4$. However, the Li precursor is typically the last precursor provided in a deposition cycle, such that the $MgF_2$ intermediate is formed prior to provision of the Li precursor.

In some embodiments a $MgF_2$ layer is deposited on the substrate surface, such as by ALD, CVD, or another process and subsequently converted to LiF. For example, a $MgF_2$ ALD cycle may be repeated one or more times to form a $MgF_2$ layer of a desired thickness on the substrate surface. In other embodiments a $MgF_2$ layer of a desired thickness is deposited by CVD. The $MgF_2$ layer is then contacted with one or more pulses of a lithium precursor to convert the $MgF_2$ layer to LiF.

In some embodiments, other types of precursors besides magnesium can be used to form intermediate materials that are subsequently converted to LiF. Thus, in some ALD processes, intermediate precursors are provided to form intermediate compositions on the surface of the substrate. In some cases, an intermediate film is formed on the substrate surface that will be modified by the application of a later lithium precursor. Such intermediate materials can comprise, for example, calcium. In some embodiments an intermediate precursor, such as a calcium precursor, can be used to form an intermediate monolayer. Calcium can be provided by using $Ca(thd)_2$, and fluorine can be supplied by $TiF_4$; however, other reactants could also be used to provide calcium, fluorine, or other suitable materials that could achieve intermediate layers. Other metal fluorides, such as, but not limited to, $BaF_2$, $SrF_2$, $LaF_3$, $YF_3$, could be used to provide suitable intermediate materials. A description about the deposition of some fluorides is described in Ph.D. thesis "Atomic Layer Deposition for Optical Applications: Metal Fluoride Thin Films And Novel Devices" by Tero Pilvi (ISBN 978-952-92-4814-8 for paperback and ISBN 978-952-10-5133-3 for pdf-version), which is incorporated herein in its entirety.

In some embodiments in which an intermediate precursor is used, the use of the intermediate precursor, such as a magnesium precursor, reduces the amount of lithium precursor required to achieve a uniform LiF film.

LiF thin films can be formed using a reactor that is suitable for ALD. For example, in some embodiments a hot-wall flow-type F-120 ALD reactor from ASM Microchemistry, Ltd. may be used. However, it will be understood that other reactor types can also be used to achieve the thin films of the present disclosure. Exemplary single wafer reactors, designed specifically to enhance ALD processes, are commercially available from ASM America, Inc. (Phoenix, Ariz.) under the trade names Pulsar® 2000 and Pulsar® 3000. Exemplary batch ALD/CVD reactors, designed specifically to enhance ALD processes, are commercially available from ASM Europe B.V (Almere, Netherlands) under the trade names ALDA400™ and A412™. In some embodiments an F-450™ ALD reactor supplied by ASM Microchemistry Oy, Espoo is used.

According to some embodiments a purge gas is used to remove excess reactant and/or reaction by-products from the reaction chamber. Any of a number of different purge gases may be used. Generally, the purge gas used should be inert and not react with either the lithium or the fluoride precursors or any other materials that may be present, such as intermediate precursors or the growing film. Suitable purge gases include, but are not limited to, nitrogen, argon and other noble gases. In some embodiments, a purge time of 4 seconds is used. However, a longer or shorter pulse time may be used depending on the particular circumstances. Typical purging times are from about 0.05 to 20 seconds, for example between about 1 and 10, or even between about 1 and 2 seconds. However, other purge times can be utilized if necessary, such as when depositing layers over extremely high aspect ratio structures or other structures with complex surface morphology.

Any suitable lithium precursor can be used that can be provided in vapor form at an appropriate deposition temperature. Such materials can include, but are not limited to, lithium 2,2,6,6-tetramethyl-3,5-heptanedionate, lithium tert-butoxide (LiO$^t$Bu) and lithium hexamethyldisilazane (LiHMDS).

In some embodiments, the lithium precursor is selected so that the ligand in the Li precursor can form a volatile compound with a metal, which is part of the fluoride precursor or another precursor in the deposition process. In one embodiment the lithium precursor is volatile enough to be used in production-type of reactors at temperature ranges from about 20° C. to about 800° C. For example, the lithium precursor may be, but is not limited to, lithium betadiketonates, lithium alkoxides, lithium alkylsilyl compounds.

Similarly, any fluoride precursor that is able to be provided in the vapor form at the appropriate deposition temperature may be used. Such materials can include, but are not limited to, $TaF_5$, $WF_6$, $MoF_x$, $NbF_5$, $TiF_4$, $F_2$, HF, species containing fluorine, such as fluorine atoms, fluorine radicals and plasma containing fluorine, organic fluorides—such as benzoyl fluoride—and ligands containing fluorine, such as hexafluoroacetylacetone (Hhfac), volatile metal compounds containing fluorine, such as metal betadiketonates comprising fluorine, such as hexafluoroacetylacetonate compounds.

In some embodiments, using Lithd as the lithium precursor and $TiF_4$ as the fluoride precursor, the precursors are evaporated from open glass boats at 180° C. and 135° C., respectively. The precursors are then pulsed into the reaction space using inert gas valving.

In some embodiments, the pulse length of the fluoride precursor is between about 0.5 seconds and about 6 seconds. In some embodiments, the pulse length of the lithium precursor is between about 1 second and about 4 seconds. A purge time of about 4 seconds is used in some embodiments between precursor pulses to remove gaseous reactant byproducts.

According to some embodiments, a growth rate of LiF of at least about 1 Å/cycle is achieved. In some embodiments, particularly those using an intermediate layer, a growth rate of approximately 1.4 Å/cycle or more may be achieved.

In some embodiments, a CVD process is used in which two or more precursor materials are simultaneously contacted to a substrate within a reaction chamber. In some embodiments, a lithium precursor and a fluoride precursor are provided simultaneously to a reaction chamber where they react on a heated substrate surface to form LiF.

In some embodiments, a CVD process is used in which two or more precursor materials with different concentrations are simultaneously applied to a substrate within a reaction chamber.

In some embodiments, a fluoride precursor is continuously flowed to the reaction chamber while the lithium precursor is pulsed to the reaction chamber where they react on a heated substrate surface to form LiF. In this case, it is preferable that the lithium precursor concentration in the pulse is substantially higher than the concentration of continuously flowed fluoride precursor. In some embodiments, a fluoride precursor is pulsed to the reaction chamber while the lithium precursor is continuously flowed to the reaction chamber where they react on a heated substrate surface to form LiF. In this case, it is preferable that the fluoride precursor concentration in the pulse is substantially higher than the concentration of continuously flowed lithium precursor.

In some embodiments, a CVD process is used in which two or more precursor materials with different concentrations are applied at least partly simultaneously to a substrate within a reaction chamber. In some embodiments, a lithium precursor and fluoride precursor are separately pulsed to the reaction chamber in a manner such that lithium precursor pulse partly overlaps the following fluoride precursor pulse. The two reactants react on a heated substrate surface to form LiF. In some embodiments, a lithium precursor and fluoride precursor are pulsed to the reaction chamber in a manner such that the fluoride precursor pulse partly overlaps the following lithium precursor pulse. The two reactants react on a heated substrate surface in the reaction chamber to form LiF.

In some embodiments, a CVD process is used in which two or more precursor materials with low concentrations are simultaneously applied to a substrate within a reaction chamber. In some embodiments, a lithium precursor and a fluoride precursor with very low concentrations (for example to avoid gas phase reactions and enable surface controlled reactions) are provided simultaneously to a reaction chamber where they react on a heated substrate surface to form LiF.

Any number of lithium-containing materials may be used to achieve a LiF thin film using a CVD process. Such materials can include, but are not limited to, lithium 2,2,6,6-tetramethyl-3,5-heptanedionate, lithium tert-butoxide (LiO$^t$Bu) and lithium hexamethyldisilazane (LiHMDS). In on embodiment the lithium precursor is selected such that one or more ligands in the Li precursor can form a volatile compound with the metal from a different precursor, typically the fluoride precursor. In one embodiment the lithium precursor is volatile enough to be used in production-type of reactors at temperature ranges from about 20° C. to about 800° C. For example, the lithium precursor in such process can comprise, but is not limited to, lithium betadiketonates, lithium alkoxides, lithium alkylsilyl compounds.

As with the ALD reactions described above, any number of fluoride-containing materials may be used to achieve a LiF thin film using the CVD processes described herein. Such fluoride-containing materials can include, but are not limited to, $TaF_5$, $WF_6$, $MoF_x$, $NbF_5$, $TiF_4$, $F_2$, HF, species containing fluorine, such as fluorine atoms, fluorine radicals and plasma containing fluorine, organic fluorides and ligands containing fluorine, such as hexafluoroacetylacetone (Hhfac), and volatile metal compounds containing fluorine, such as metal hexafluoroacetylacetonate compounds.

In some embodiments, a CVD process is carried out at a substrate temperature of between about 100° C. to about 800° C., preferably between 200-600° C. Pulse length, purge lengths and precursor concentrations applied in the embodiments using CVD process containing pulses can be selected on the basis what is disclosed in the case of ALD process pulses described herein. For example, high concentration or substantially higher concentration of precursor may be, for example, the concentration applied in pulses in ALD process and low concentration or substantially lower concentration may be, for example, less than ⅕, or preferably less than 1/10 of the concentration of precursor pulses in ALD process. In partly simultaneously precursor pulses the first precursor pulse might overlap 50% or less, preferably 30% or less, with the following precursor pulse.

According to some embodiments, LiF thin films deposited according to the present disclosure may achieve a conformality of at least about 50%, at least about 80%, at least about 90%, or even at least about 95%. Such conformalities may be achieved in various structures. In some embodiments the conformality is achieved for a film deposited on a structure having an aspect ratio (depth/width) of more than about 3, more than about 5, or more than about 10. In some embodiments, such as where high-surface area substrates are needed, the aspect ratios of the structures can be more than about 20, more than about 50, or even more than about 100.

Example 1

LiF Thin Film Deposition Using Two Precursors

LiF thin films were deposited by pulsing Lithd and $TiF_4$ precursors onto Si(111) substrates. The growth rate and characteristics of the resulting films were evaluated in the temperature range of about 250° C. to about 350° C. The upper limit of 350° C. was chosen because Lithd may decompose at about 375° C. High Lithd doses of about 600 mg/750 cycles were used, which helped achieve uniform films. However, only a small amount of $TiF_4$ was needed for each deposition experiment.

FIG. 1 shows the growth rate of the LiF thin films as a function of temperature. The growth rate decreases when going from about 250° C. to about 325° C. and increases again at about 350° C. Usually a rising growth rate at high temperatures indicates decomposition of precursors; however, in this case, it is highly unlikely as both precursors have been confirmed to stand temperatures up to about 350° C. It is possible that the high roughness of these films, affects the measurement somewhat, leading to an apparent higher growth. Due to the roughness of these films and consequent challenges in the UV-Vis spectra fitting, the error bars in FIG. 1 are about 8%.

Figure 2:
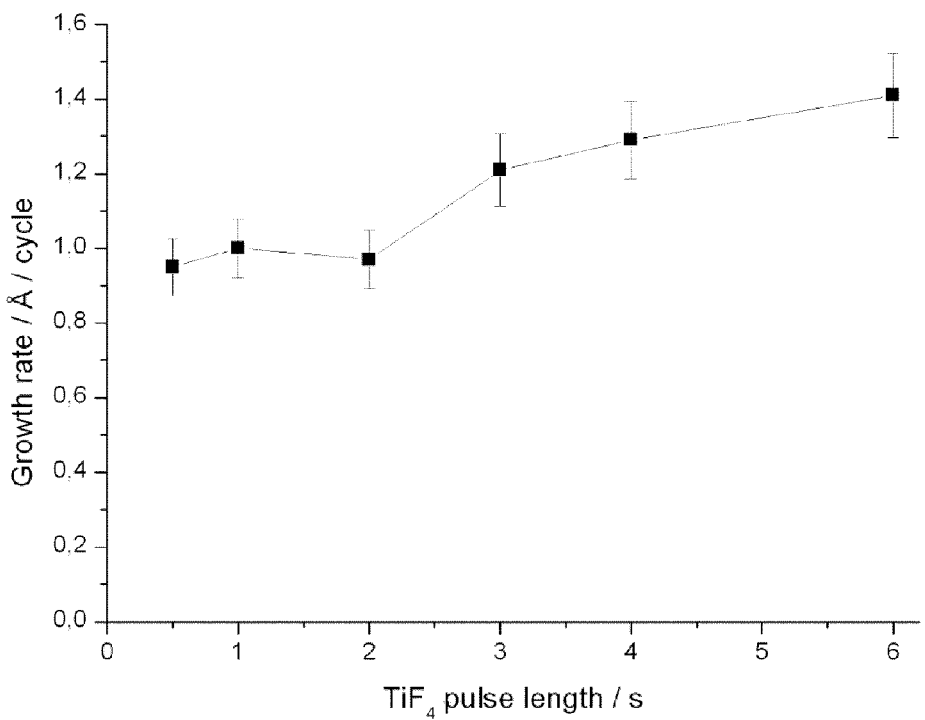
FIG. 2 illustrates the growth rate of LiF thin films as a function of $TiF_4$ pulse length according to some embodiments.
Figure 3:
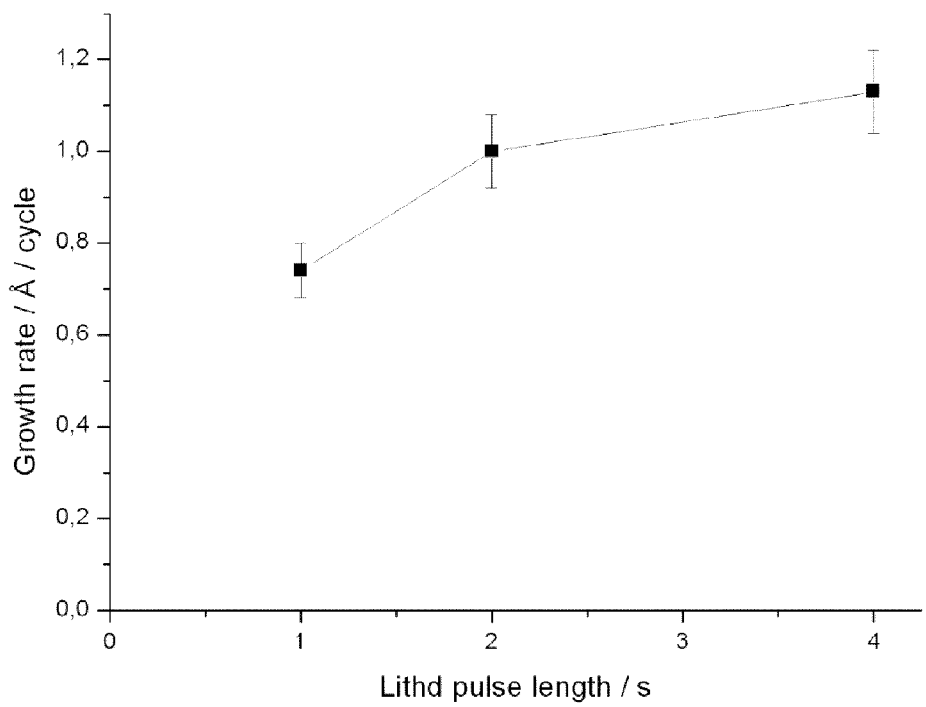
FIG. 3 illustrates the growth rate of LiF thin films as a function of Lithd pulse length according to some embodiments.

FIGS. 2 and 3 illustrate the results of a study of the saturation of the growth rate with increasing pulse lengths. The saturation tests were conducted at 325° C. This temperature was chosen based on the following considerations: higher deposition temperatures usually lead to films with fewer impurities; 350° C. showed an increase in the growth rate; fluoride thin films deposited by ALD at high temperatures often show large rms roughnesses, which can lead to challenges in film characterization. Purge times used were 4 seconds after both precursor pulses, which is relatively long for the reactor types used in these experiments; however, the choice was made based on the sensitivity of the growth to the Lithd dose. The growth rate of the thin films stayed constant at short $TiF_4$ pulses—about 0.5 seconds to about 2 seconds—the growth rate being about 1 Å/cycle. Longer pulses resulted in an almost linearly increasing growth rate. No saturation behavior was seen with different Lithd pulse lengths. The growth rate increases with longer Lithd pulse times: about 0.74 Å/cycle with 1 second pulses and about 1.13 Å/cycle at 4 second pulses (see FIG. 3). In this experiment, 4 seconds was the upper limit because of the high Lithd consumption. The amount of Lithd that can be loaded into the reactor readily became a limiting factor in these experiments.

In typical ALD processes, the thickness of the films increases linearly with the number of cycles. This behavior was studied by depositing LiF thin films with 750, 850, and 1000 cycles at about 325° C. In these experiments, the high lithium consumption defined the upper limit for the cycle number. The lower limit was chosen so that the film thickness could still be reliably fitted from the UV-Vis measurements. It was found that the thickness of the 750-cycle film was about 73% of the thickness of the 1000-cycle film. The 850-cycle film achieved a thickness that was about 87% the thickness of the 1000-cycle film. Accordingly, the thickness of the LiF thin films can be controlled well by choosing an appropriate cycle number.

In addition to thickness values, UV-Vis spectra fitting provided tentative values for the refractive indices of the LiF films. At 580 nm LiF has a refractive index of about 1.39. The deposited films had refractive indices in the range of about 1.37 to about 1.43 where the highest values were obtained from films deposited with long $TiF_4$ pulses. Using 2-second pulses for both Lithd and $TiF_4$ resulted in a narrower refractive index range of about 1.37 to about 1.39.

Figure 4:
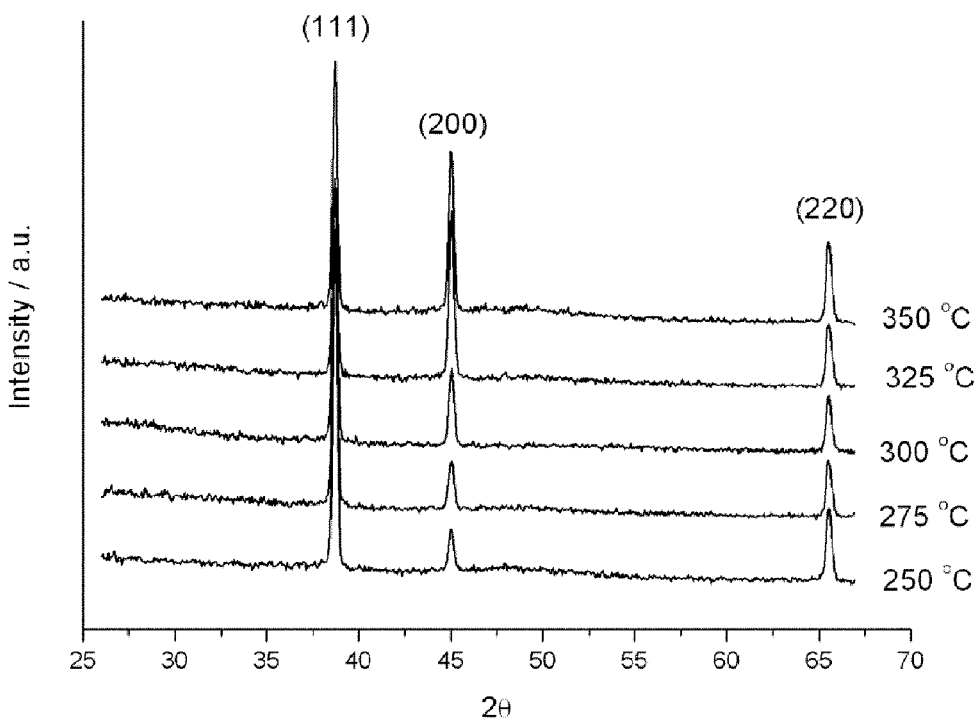
FIG. 4 shows X-ray diffractograms of LiF thin films deposited at various temperatures according to some embodiments.
Figure 5:
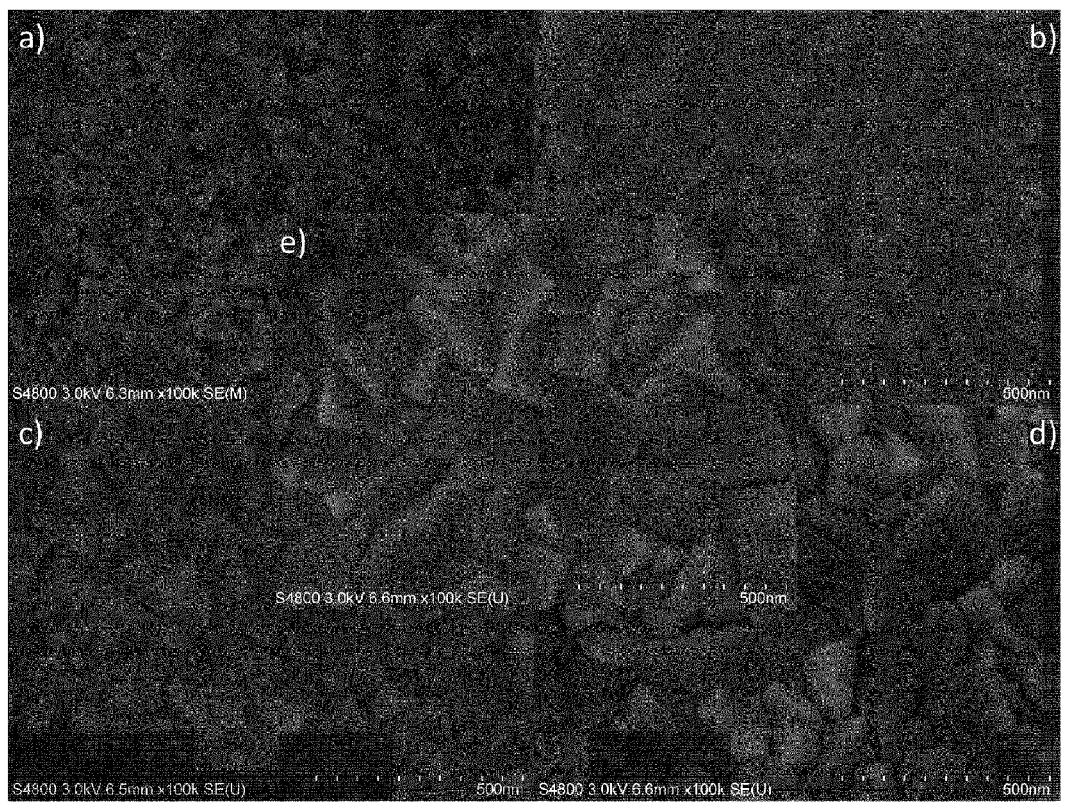
FIG. 5 provides field emission scanning electron microscopy ("FESEM") images of LiF thin films deposited at different temperatures on $SiO_2$/Si(111) substrates according to some embodiments.

FIG. 4 illustrates the results of a study of the deposited films—2-second precursor pulses and 4-second purges—by bracing incident X-ray diffraction ("XRD") experiments in which the films were found to be highly crystalline. Reflections corresponding to the LiF crystal planes 111, 200, and 220 were recognized with no detectable crystalline impurity phases present. The FESEM images in FIG. 5 corroborate the XRD results. All the films were crystalline and showed larger crystals at higher deposition temperatures.

TABLE 1

Surface roughness of LiF films on $SiO_2$/Si(111) substrates

| Film | Deposition Temp. (° C.) | Thickness (nm) | Roughness (nm) |
|---|---|---|---|
| a) | 250 | 111 | 6.3 |
| b) | 275 | 97 | 9.5 |
| c) | 300 | 88 | 12.3 |
| d) | 325 | 73 | 15.9 |
| e) | 350 | 90 | 20.6 |

Figure 6:
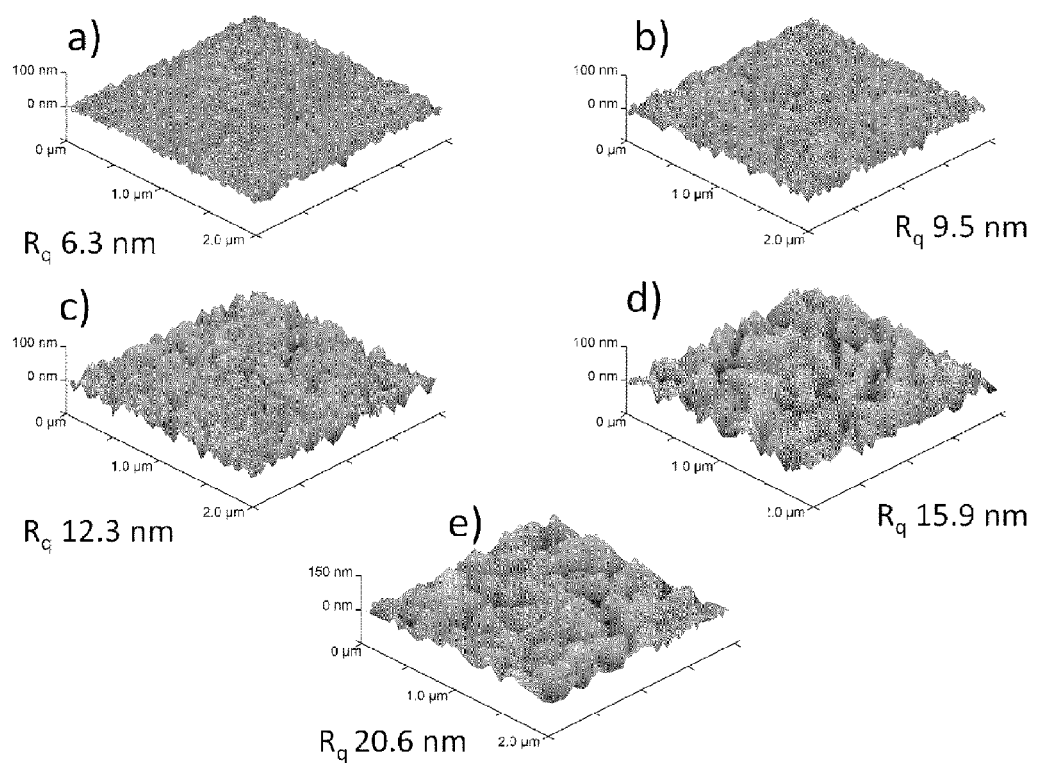
FIG. 6 illustrates atomic force microscopy ("AFM") images of LiF thin films deposited at different temperatures according to some embodiments.

The morphology of the LiF thin films was studied in more detail with AFM measurements. The results are shown in Table 1 above, and the various AFM images are shown in FIG. 6. The rms roughness of the films increases with increasing deposition temperature, being about 6.3 nm for the film a) deposited at about 250° C. (111 nm) and about 20.6 nm for the film e) deposited at about 350° C. (90 nm). The change in the roughness is almost linear, showing no large increase at deposition temperatures higher than about 300° C. despite the fact that the morphology could be seen to change considerably in the FESEM images. Such a linear increase in rms roughness has not been seen before in ALD fluorides. Usually the roughness stays rather constant until a certain threshold deposition temperature, after which it increases dramatically.

The impurity contents of the films deposited at different temperatures were analyzed by elastic recoil detection analysis ("ERDA") measurements. The results are shown in Table 2 below. The films show carbon and hydrogen impurities of about 0.5 atomic % at all deposition temperatures. The somewhat larger oxygen impurity originates partly from the native $SiO_2$ layer of the substrate, as the oxygen concentrations were not corrected for the oxygen in this layer. The hydrogen, carbon, and oxygen impurity levels were too low for dept profiling. As a result, it is difficult to say whether these impurities originate from the lithium precursor or if they are simply surface contamination from long storage and handling in air. In any case, the films are very pure LiF with the lithium to fluoride ratio close to unity in all the films except the one deposited at 275° C. However, this deviation remains within the statistical uncertainty. One sample, deposited with a 6-second $TiF_4$ pulse, was also studied to determine whether the larger refractive index of this film was due to different impurity levels, but no difference could be found. It is noteworthy that no titanium could be detected in the films (detection limit 0.1 atomic %).

TABLE 2

Composition (at %) of LiF films deposited at different temperatures on $SiO_2$/Si(111) substrates

| Element | 250° C. | 275° C. | 300° C. | 325° C. | 325° C.[†] | 350° C. |
|---|---|---|---|---|---|---|
| Li | 49.2 | 52.2 | 49.3 | 47.3 | 48.0 | 48.3 |
| F | 48.9 | 46.2 | 48.7 | 49.8 | 50.4 | 49.6 |
| O | 0.9 | 0.7 | 1.1 | 1.5 | 0.7 | 1.1 |
| C | 0.5 | 0.4 | 0.4 | 0.7 | 0.5 | 0.6 |
| H | 0.52 | 0.45 | 0.53 | 0.65 | 0.44 | 0.44 |
| Li/F | 1.01 | 1.13 | 1.01 | 0.95 | 0.95 | 0.97 |

[†]6 second $TiF_4$ pulse

Adhesion of the thin films to the $SiO_2$/Si(111) substrate was tested with the Scotch tape test. The films were deposited at about 325° C. A 100 nm film peeled almost completely off the substrate, whereas less damage was noted for a 73 nm film. The relatively poor adhesion of the thicker films could be noticed also during normal handling, as scratch marks were easily formed in the films. In contrast, the same could not be detected with the thinner samples.

Example 2

LiF Thin Film Deposition Using Three Precursors

In this example, an ALD process that included forming an intermediate layer was used to deposit various LiF thin films. The lithium precursor used was Lithd. The fluoride precursor was $TiF_4$. The intermediate precursor in these experiments was $Mg(thd)_2$. The films in this example were deposited at various temperatures between about 300° C. and about 350° C. The films were studied by UV-Vis spectrometry, FESEM, XRD, AFM, time-of-flight elastic recoil detection analysis ("ToF-ERDA"), energy dispersive X-ray diffraction ("EDX"), and a Scotch tape test. The experimental methods resulted in films having a growth rate of approximately 1.4 Å/cycle. According to ToF-ERDA measurements, the films were pure LiF with very small Mg and Ti impurities, the largest majority being hydrogen with contents below 1 atomic %.

LiF films were deposited in a hot-wall flow-type F-120 ALD reactor (ASM Microchemistry Ltd.). Deposition temperatures were varied between about 275° C. and 350° C. The pressure in the reactor during depositions was of the order of about 5 mbar. The films were deposited onto 5 cm×5 cm Si(111) substrates with native $SiO_2$. $Mg(thd)_2$ (Volatec Oy, Finland), Lithd (Strem Chemicals Inc., 98+%, sublimed at 240° C./0.07 mbar to densify the precursor), and $TiF_4$ (Strem Chemicals Inc., 98%) were evaporated inside the reactor from open glass boats at 110° C., 180° C., and 130° C., respectively. Pulsing of the precursors was done by inert gas valving. The $Mg(thd)_2$ pulse length was either 3 seconds or 4 seconds, which had earlier been determined as a sufficient pulse to produce $MgF_2$. The $TiF_4$ pulse was varied between 0.5 seconds and 2 seconds, and the Lithd pulse between 0.5 seconds and 4 seconds. Nitrogen, produced by domnick hunter G2100E nitrogen generator, was used as a carrier and purging gas. Purge periods of about 1 second to about 2 seconds were used to separate the precursor pulses and remove gaseous reaction side products.

Figure 7:
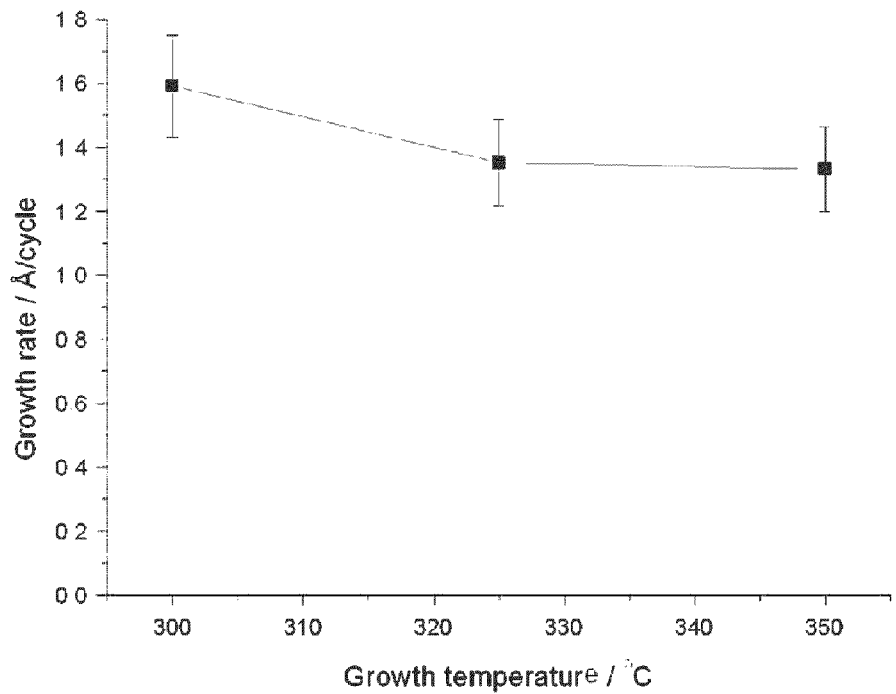
FIG. 7 illustrates the growth rate of LiF thin films as a function of deposition temperature according to some embodiments.

LiF was deposited on native oxide covered Si(111) substrates with the following pulsing sequence: $Mg(thd)_2$-$TiF_4$—Lithd-$TiF_4$. The growth characteristics and rates were studied at 275° C. to 350° C. 350° C. was chosen as the upper limit due to the decomposition of the Lithd precursor at about 375° C., as already mentioned previously. FIG. 7 shows the growth rate of an LiF thin film as a function of temperature. Below about 300° C. the growth rate was approximately four times higher than the rates seen in FIG. 7, but the films were nonuniform, which is why these points have been omitted from the graph. As can be seen from FIG. 7, the growth rate per cycle is approximately 1.4 Å at about 325° C. and about 350° C., and increases at about 300° C. The temperature range of constant growth rate is not very wide. Further deposition experiments done at about 325° C. indicated good repeatability. The growth rate is somewhat greater than in Example 1 above, where the growth rate was approximately 1 Å/cycle at 325° C.

Figure 8:
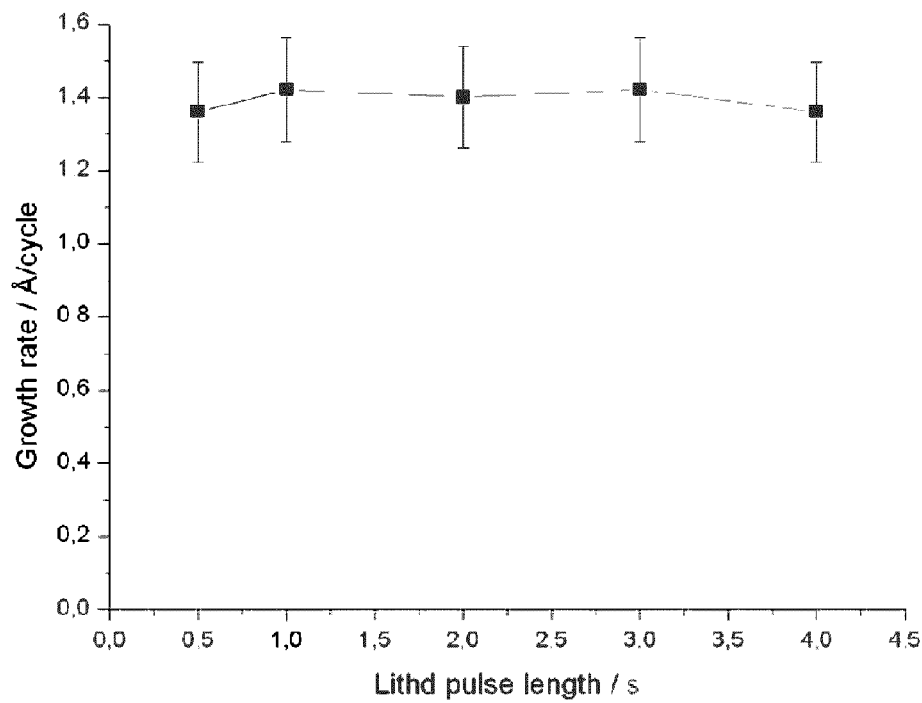
FIG. 8 illustrates the growth rate of LiF thin films as a function of Lithd pulse length according to some embodiments.

Saturation of the growth rate with increasing precursor pulse length was studied for both the Lithd and $TiF_4$. The $Mg(thd)_2$ pulse length was kept at 3 seconds based on the earlier results in $MgF_2$ depositions. FIG. 8 shows the LiF film growth rate as a function of the Lithd pulse length. The growth rate remains at approximately 1.4 Å/cycle from about 0.5 seconds to about 4.0 seconds. However, as will be discussed below, the 0.5-second Lithd pulse resulted in a thin film with some $MgF_2$ impurity, and the 1-second pulse was not enough to promote film growth on the whole substrate, leaving the trailing edge of the substrate with only a very thin film. The 2-second Lithd pulse was sufficient for self-limiting ALD-type growth across the whole substrate and was therefore used in the majority of depositions for these experiments. In contrast, no saturation with Lithd pulse length was observed in the LiF process without $Mg(thd)_2$.

Figure 9:
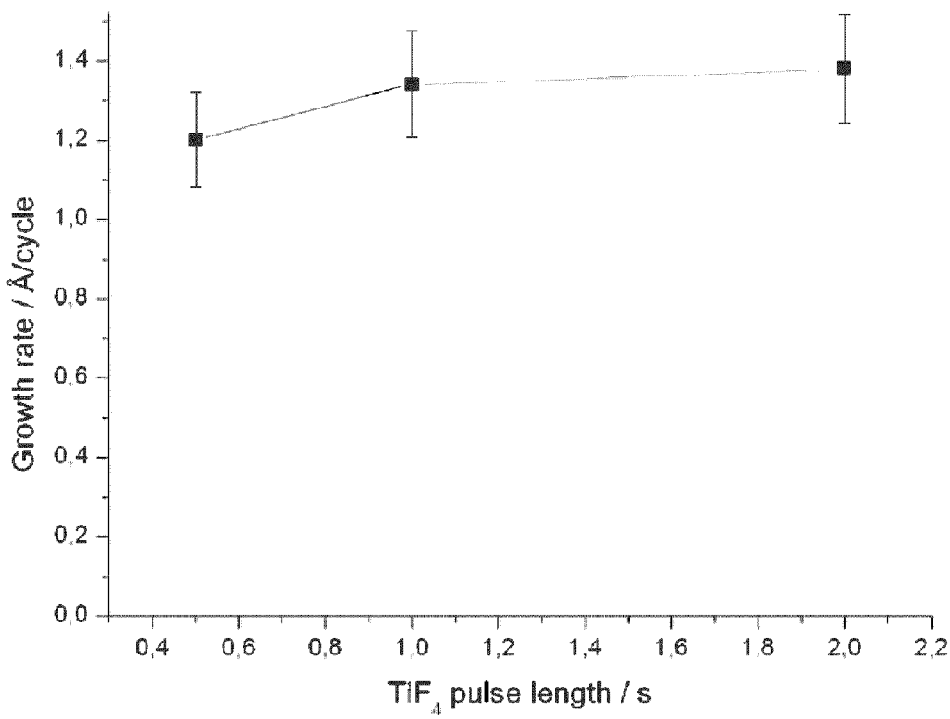
FIG. 9 illustrates the growth rate of LiF thin films as a function of $TiF_4$ pulse length according to some embodiments.

FIG. 9 shows the LiF growth rate as a function of the $TiF_4$ pulse length. A pulse length of 0.5 seconds resulted in a lower growth rate of about 1.2 Å/cycle, but the 1-second pulse seemed long enough for saturative growth. However, in most depositions the TiF$_4$ pulse was kept at 2 seconds to ensure complete saturation.

Figure 10:
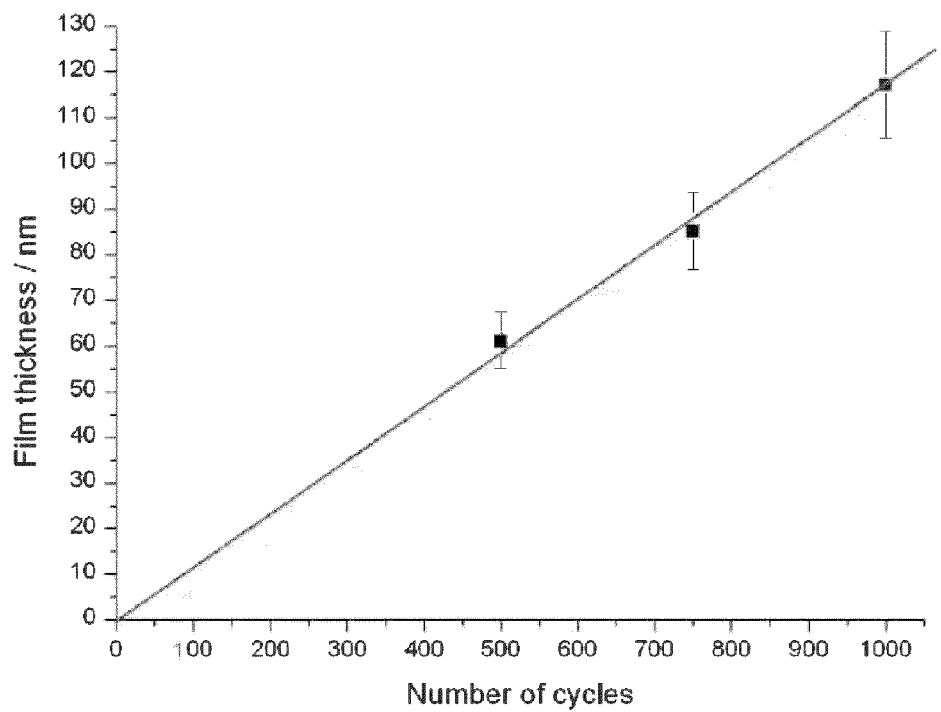
FIG. 10 illustrates the film thickness of LiF thin films as a function of the number of cycles according to some embodiments.

One advantage of ALD-type thin film growth is the easy tuning of the film thickness with the number of deposition cycles. This was tested with the LiF process by depositing 500, 750, and 1000 cycles of LiF. The pulsing sequence was 3 seconds Mg(thd)$_2$ accompanied by 2-second TiF$_4$ and Lithd pulses and 2-second purges between the precursor pulses. As can be seen from FIG. 10, the thickness increases fairly linearly with the number of cycles without a noticeable incubation period. The growth rate can be calculated to be about 1.2 Å/cycle, which is a bit lower than the growth rate obtained from the saturation experiments. A slightly lower Lithd source temperature of 177° C. (vs 180° C. in other depositions) was used in these experiments to reduce the Lithd consumption and thereby facilitate the application of 1000 cycles. Depositing films with over 1000 cycles was hindered by both the large Lithd consumption and the adhesion problems of the films that are discussed below.

Figure 11:
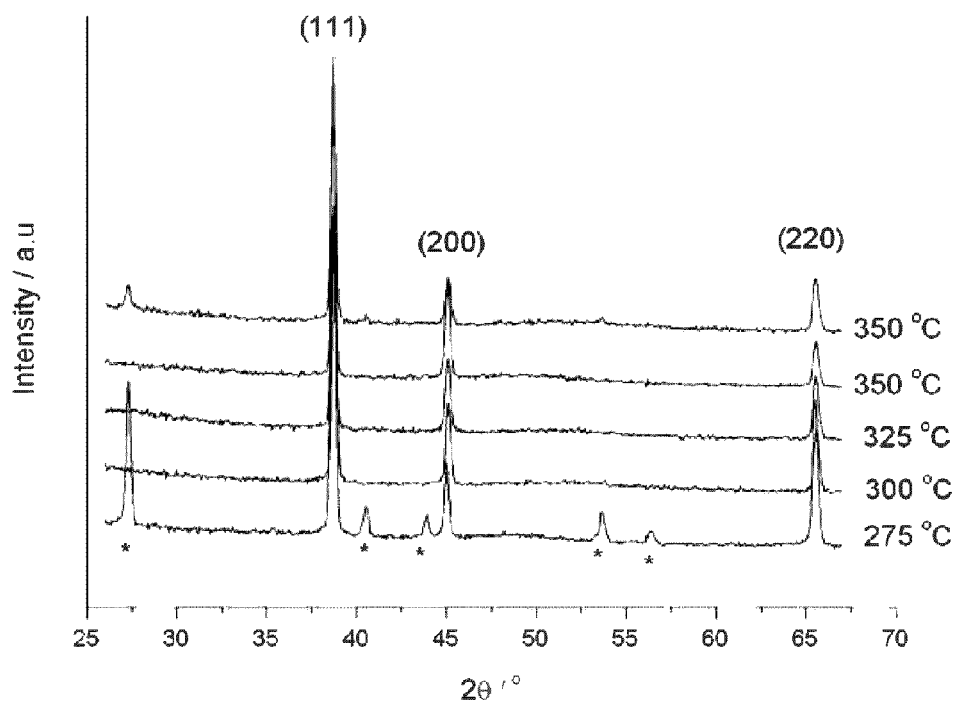
FIG. 11 illustrates X-ray diffractograms of LiF thin films deposited at various temperatures according to some embodiments.
Figure 12:
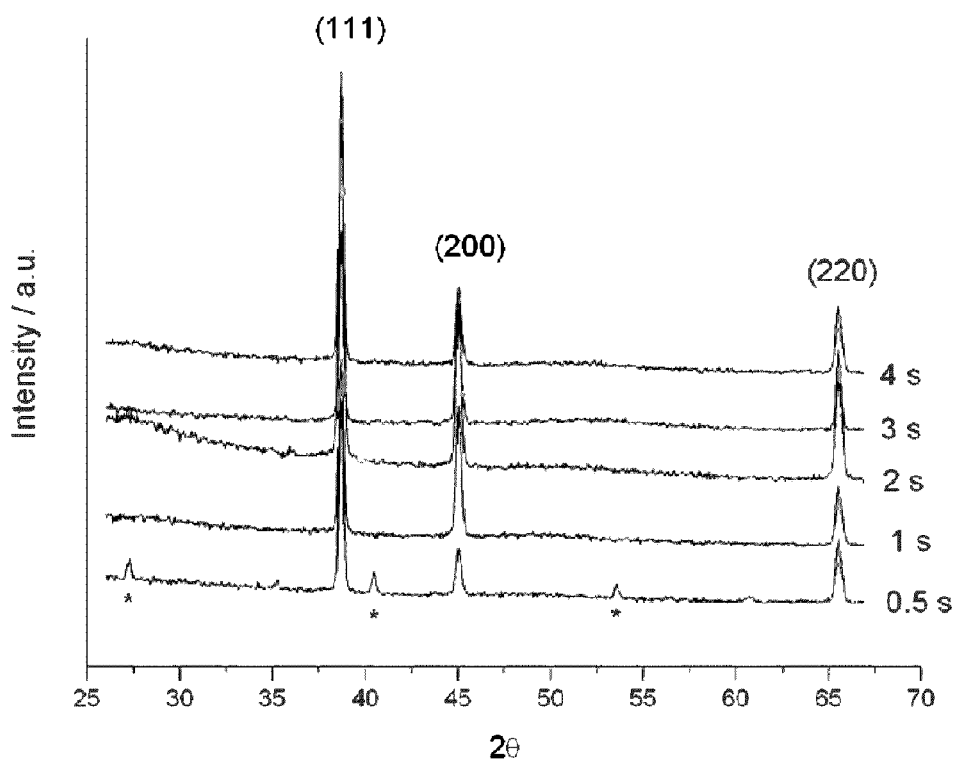
FIG. 12 illustrates X-ray diffractograms of LiF thin films deposited using different Lithd pulse lengths according to some embodiments.

The LiF films were highly crystalline, as can be seen in the GI-XRD patterns in FIGS. 11 and 12. Reflections corresponding to the crystal planes (111), (200), and (220) can be recognized. In the film deposited at about 275° C. crystalline MgF$_2$ could be detected in addition to LiF (see FIG. 11). The same was true for one sample deposited at about 350° C. (see FIG. 11); however, in later experiments this result could not be repeated and only phase pure LiF was formed also at about 350° C. The Lithd pulse length series, deposited at about 325° C., shows the formation of crystalline LiF, with some crystalline MgF$_2$ present only in the film deposited with the shortest 0.5-second Lithd pulses (see FIG. 12). The TiF$_4$ pulse length series showed no MgF$_2$ formation with any TiF$_4$ pulse length.

Figure 13:
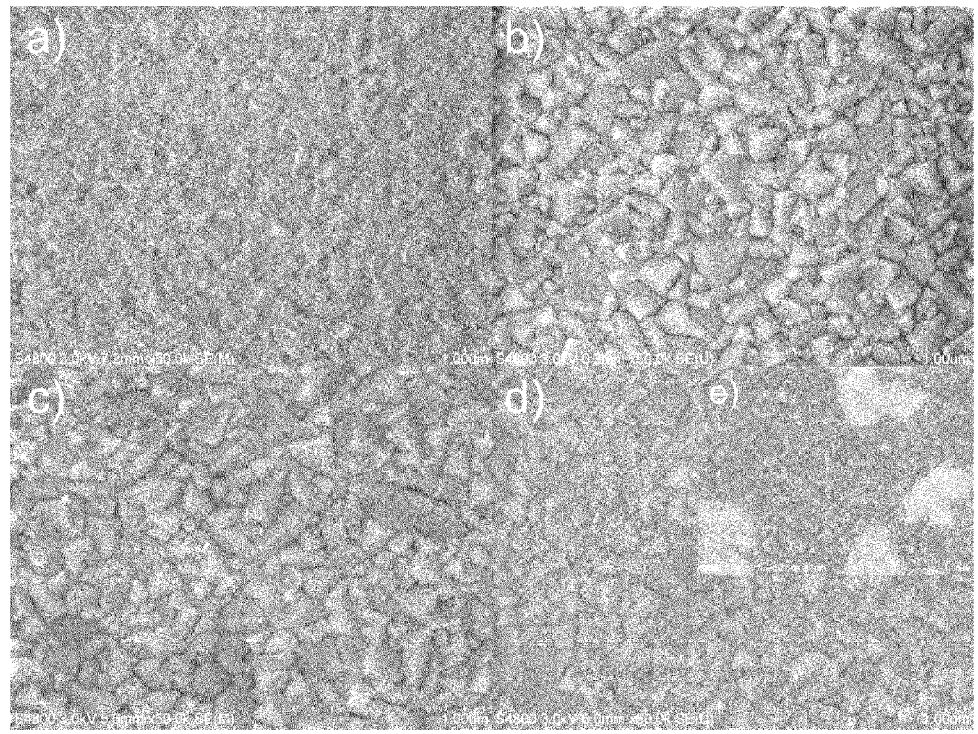
FIG. 13 illustrates FESEM images of LiF thin films deposited at different temperatures on $SiO_2/Si(111)$ substrates according to some embodiments.

The morphology of the films was studied with both FESEM and AFM. FIG. 13 shows FESEM images of films deposited at about 275° C. to about 350° C. All the films except the much thicker and impure sample deposited at about 275° C. showed large grains, even as large as about 0.2 μm in diameter. One film deposited at about 350° C., showed traces of MgF$_2$ in the GI-XRD experiment (see FIG. 11), and had shapeless globules on top of the film surface (see FIG. 13e). EDX measurements revealed these to consist of a Mg-rich substance, most likely MgF$_2$. Magnesium could not be detected with EDX from the highly crystalline parts of the film. Therefore, it appeared that the globules were the MgF$_2$ phase while the rest of the film is LiF.

Figure 14:
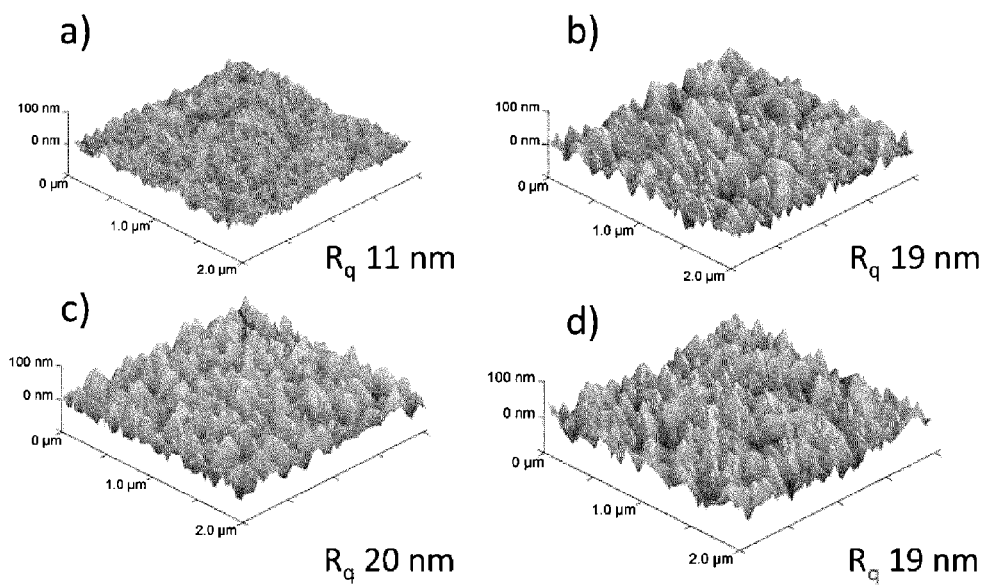
FIG. 14 illustrates AFM images of LiF thin films deposited at different temperatures according to some embodiments.

The AFM measurements confirmed the FESEM results (FIG. 14). All the films were very rough, with rms roughnesses of about 19 nm to about 20 nm for the 67 nm to 80 nm thick films deposited at about 300° C. to about 350° C., and about 11 nm for the approximately 300 nm thick, impure film deposited at about 275° C. This roughness, combined with the low thickness of the films posed challenges in the film thickness measurements: X-ray reflection measurements could not be used for films this rough. The previously reported ALD process for LiF also produced highly crystalline and rough films; however, in these films the roughness increased almost linearly with the deposition temperature. The AFM measurements also revealed that there were some areas where the film seemed to have flaked off, most notably in the samples deposited at about 275° C. and about 300° C. The films deposited at higher temperatures showed less flaking. Some areas with film flaked off were also visible in FESEM. To determine whether these filmless areas were a result of the growth process or merely due to sample preparation for the microscopy analyses, a further FESEM study was conducted. In this experiment, a film deposited at about 325° C. was imagined with FESEM without any sample preparation procedures, using the whole 5 cm×5 cm substrate as the sample. It could be seen that this film showed no flaking, being uniform with no filmless areas. The defects seen in the prior samples can, therefore, be attributed to the cutting procedure used to make smaller samples from the original substrate, and are due to the poor adhesion of the films.

Figure 15:
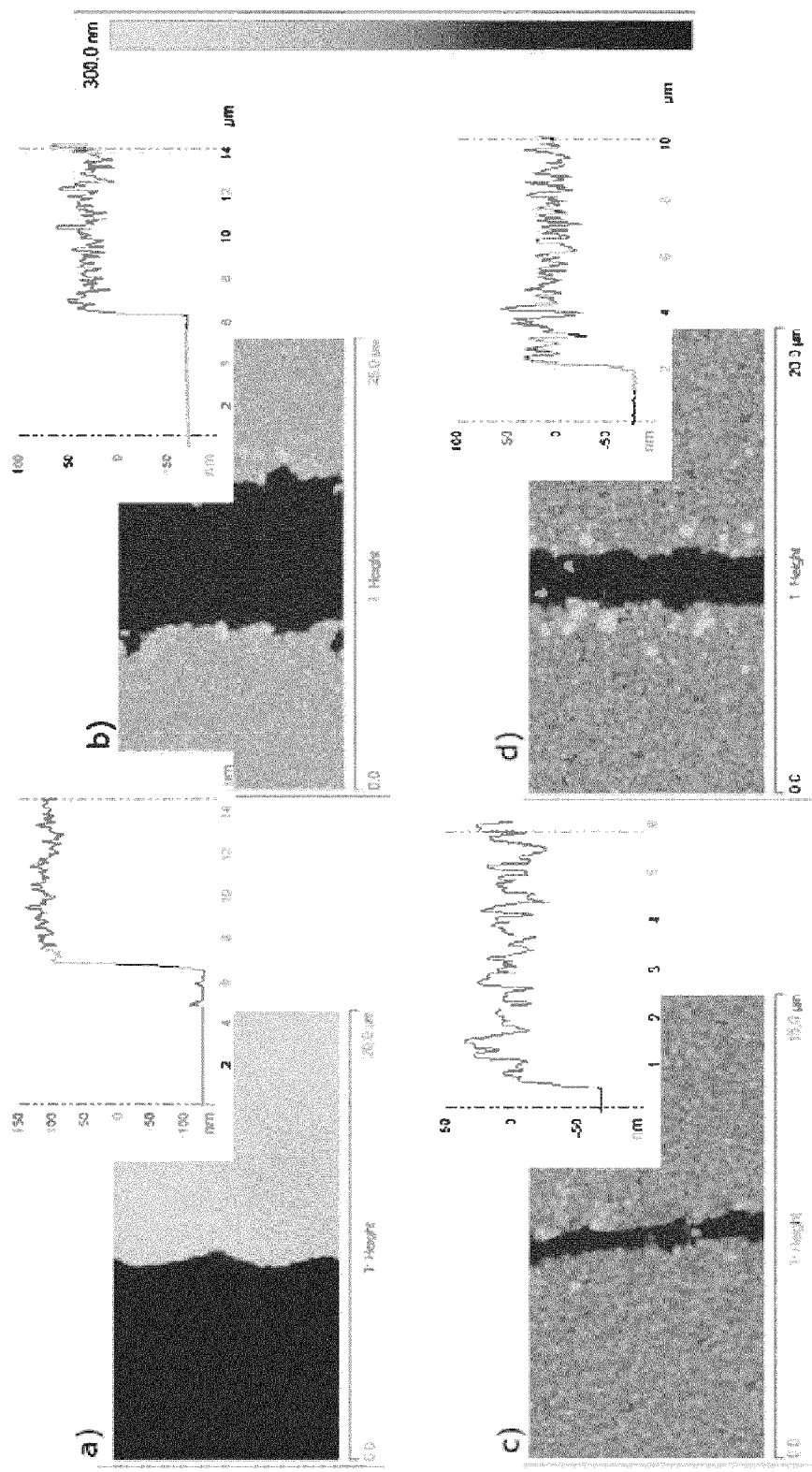
FIG. 15 illustrates thickness measurements of some embodiments of LiF thin films using AFM.

Given the challenges in thickness determination of the thin and rough films, AFM measurements were also used to probe the thickness of the films deposited at different temperatures (see FIG. 15). The film thickness was evaluated with a depth tool, which measures the height difference between two dominant features that occur at distinct heights. Cracks on the film surface were used as measuring points for the substrate surface. The AFM experiments produced slightly higher thickness values than the UV-Vis measurements. However, it is possible that particles at the edges of the scratches interfered somewhat with the measurement, producing larger thicknesses. In addition, the poor adhesion may have influenced the AFM thickness measurements. In any case, the thickness range was similar in the two experiments.

Figure 16:
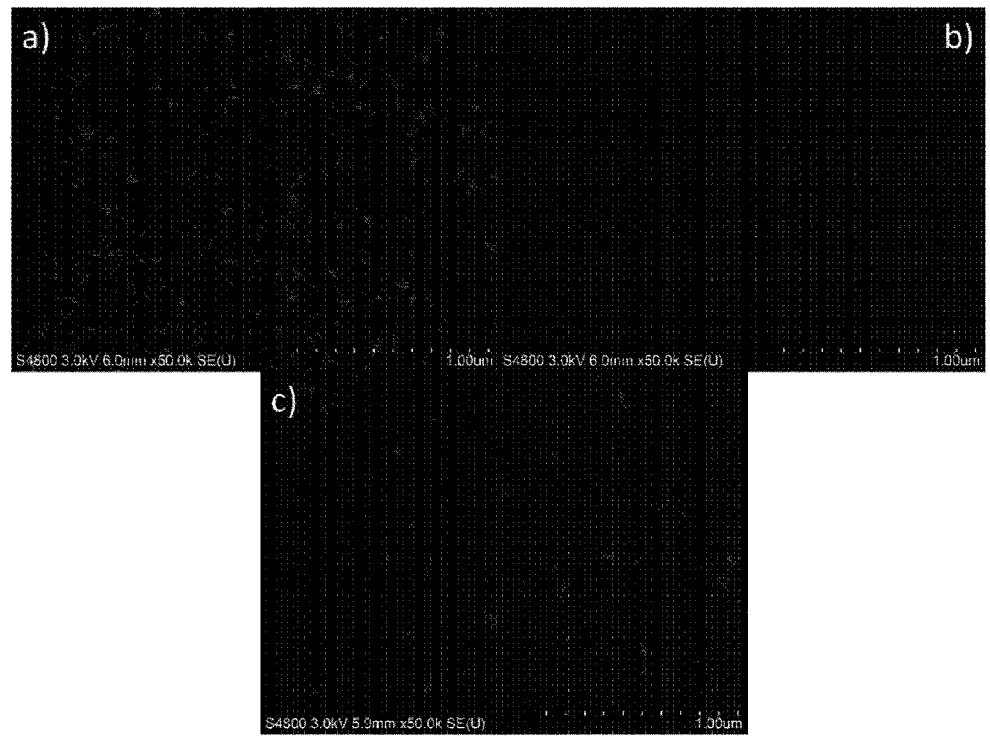
FIG. 16 illustrates FESEM images of some embodiments of LiF thin films formed using different numbers of cycles.

FESEM images of films deposited with 500, 750, and 1000 cycles at about 325° C. are shown in FIG. 16. The LiF grain size appears to grow notably with increasing film thickness. With 1000 cycles, grains as large as about 0.4 μm in diameter can be found. The same phenomenon has been detected in evaporated LiF films deposited at about 300° C. The increase in thickness and grain size was accompanied by a prominent decrease in the adhesion of the films to the substrate: the breaking and falling off of the film made handling the samples difficult. Some adhesion problems were also noted during the AFM study: at times the probe lost contact with the surface, and vibrational noise could also be detected.

Films deposited at different temperatures and with different Lithd pulse lengths were analyzed by ToF-ERDA. The results are shown in Table 3 below. In the films deposited at about 300° C. to about 350° C., hydrogen makes up the largest impurity, with the highest value of 0.9 at-% in a film deposited at 325° C. Both carbon and oxygen impurities are below about 0.3 atomic % in all the films except the same film deposited at about 325° C.: the content of carbon is about 0.5 atomic % in this particular film. There is not a notable decrease in impurity contents when going to higher deposition temperatures, but the Li/F ratio does increase and approaches unity, indicating better LiF quality. In all the films deposited at about 300° C. to about 350° C., the Mg and Ti impurity levels are negligible. The film deposited at about 275° C. showed prominent magnesium impurities, which was also indicated by the GI-XRD experiment (see FIG. 11). Other impurities were low in concentration, approximately 1 atomic % in total with silicon forming the largest component of the impurities. It is likely that the Si impurity originated from the substrate that is visible through the cracks in the film. The impurity levels are similar to LiF films deposited without Mg(thd)$_2$ discussed in Example 1 above.

TABLE 3

Composition (at %) of LiF films deposited at different temperatures on SiO$_2$/Si(111)

| Element | 275° C. (2 s Lithd pulse) | 300° C. (4 s Lithd pulse) | 325° C. (4 s Lithd pulse) | 325° C. (2 s Lithd pulse) | 350° C. (4 s Lithd pulse) |
|---|---|---|---|---|---|
| Li | 43 | 48 | 48 | 49 | 49 |
| F | 53 | 52 | 50 | 49 | 50 |
| Mg | 3.9 | — | 0.04 | 0.01 | 0.02 |
| Ti | 0.11 | — | 0.03 | 0.08 | 0.08 |
| O | 0.16 | 0.22 | 0.18 | 0.25 | 0.25 |
| C | <0.05 | 0.14 | 0.54 | 0.23 | 0.2 |
| H | 0.15 | 0.32 | 0.9 | 0.6 | 0.6 |
| Si | 0.55 | — | — | — | — |
| Li/F | 0.81 | 0.92 | 0.96 | 1 | 0.98 |

Figure 17:
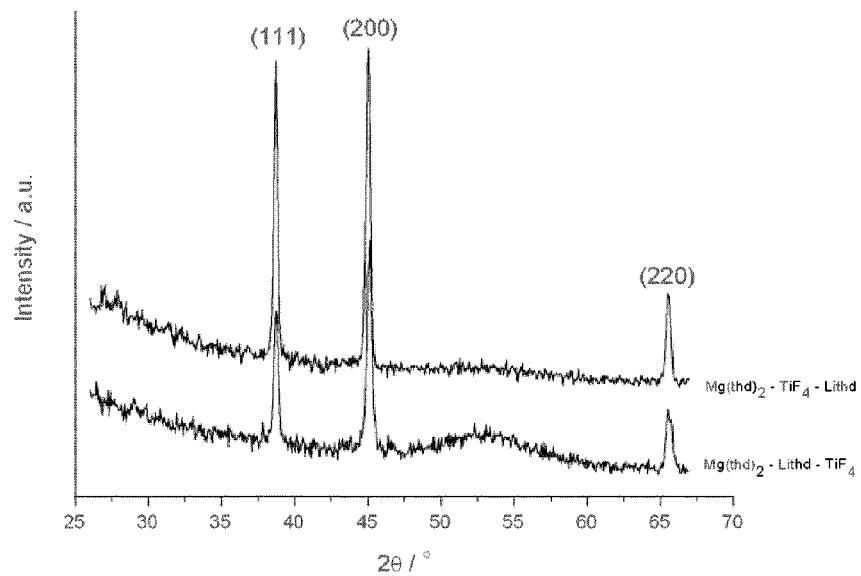
FIG. 17 illustrates X-ray diffractograms of some embodiments of LiF thin films deposited at the same temperature and $TiF_4$ pulse length but using different pulsing schemes.
Figure 18:
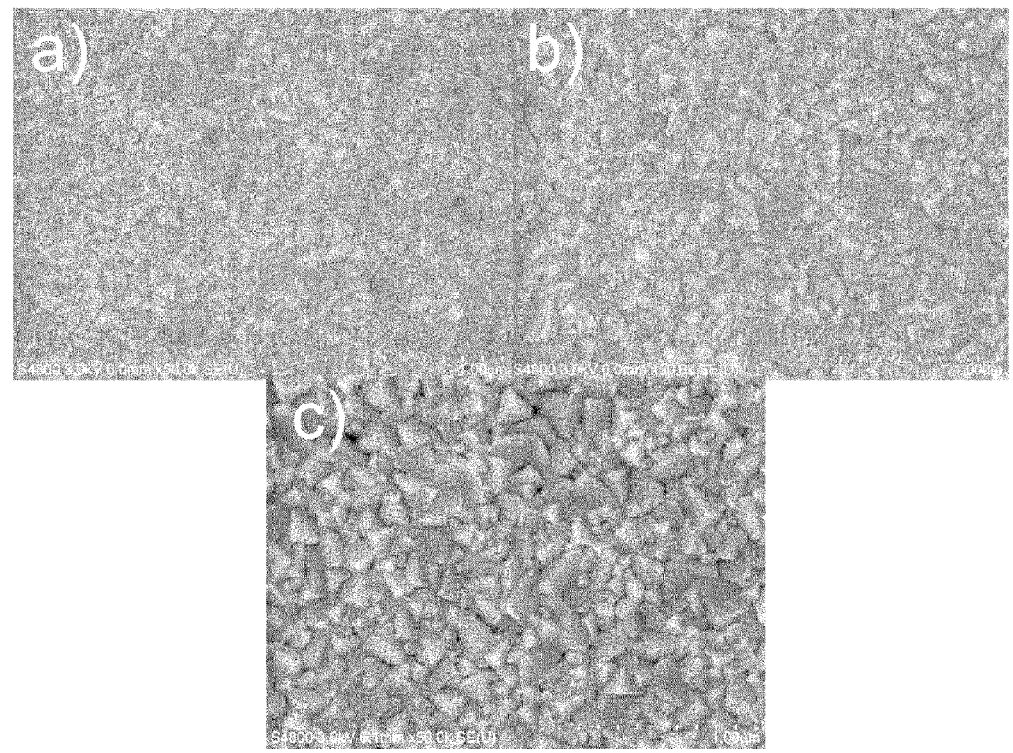
FIG. 18 illustrates FESEM images of some embodiments of LiF thin films deposited at the same temperature and $TiF_4$ pulse length but using different pulsing schemes.

It is surprising that the cycling of Mg(thd)$_2$-TiF$_4$—Lithd-TiF$_4$ produced LiF with no or very little magnesium. To understand the growth process, different pulse sequences were tested. Leaving out one of the TiF$_4$ pulses did not affect the outcome of the depositions in a major way: both Mg(thd)$_2$-Lithd-TiF$_4$ and Mg(thd)$_2$-TiF$_4$—Lithd pulsing sequences produced LiF at about 325° C., as can be seen from the GI-XRD measurements in FIG. 17. However, the sequence Mg(thd)$_2$-Lithd-TiF$_4$ deposited a film that was not uniform along the substrate, leaving the trailing edge with less film than the leading edge. The reason for the uniformity issue in this sample is most likely due to a too low Lithd dose during pulsing. The pulse sequence of Mg(thd)$_2$-TiF$_4$—Lithd; however, produced a film that was only slightly thinner than those deposited with two TiF$_4$ pulses and the film was uniform across the substrate. In FIG. 18, FESEM images of these two films are compared to a film deposited at the same temperature, with the normal pulse sequence. As can be seen from the SEM images, leaving out one TiF$_4$ pulse also results in films with large grains. However, the grains seem to be somewhat smaller than in the film deposited with two TiF$_4$ pulses. This might have to do with the fact that using two TiF$_4$ pulses naturally results in a longer cycle time, giving LiF more time to form larger crystals.

Based on these experiments, a possible reaction mechanism for the deposition of LiF is proposed. In the first step, MgF$_2$ is formed from Mg(thd)$_2$ and TiF$_4$. During the Lithd pulse, lithium replaces magnesium in the film, generating LiF. During this step, magnesium leaves the film, most likely by regenerating Mg(thd)$_2$ with the thd-ligands coming from Lithd. It is believed that the following reaction sequence occurs:

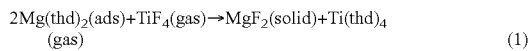

$$2\text{Mg(thd)}_2(\text{ads}) + \text{TiF}_4(\text{gas}) \rightarrow \text{MgF}_2(\text{solid}) + \text{Ti(thd)}_4(\text{gas}) \qquad (1)$$

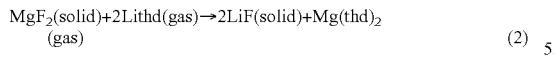

$$\text{MgF}_2(\text{solid}) + 2\text{Lithd}(\text{gas}) \rightarrow 2\text{LiF}(\text{solid}) + \text{Mg(thd)}_2(\text{gas}) \qquad (2)$$

Figure 19:
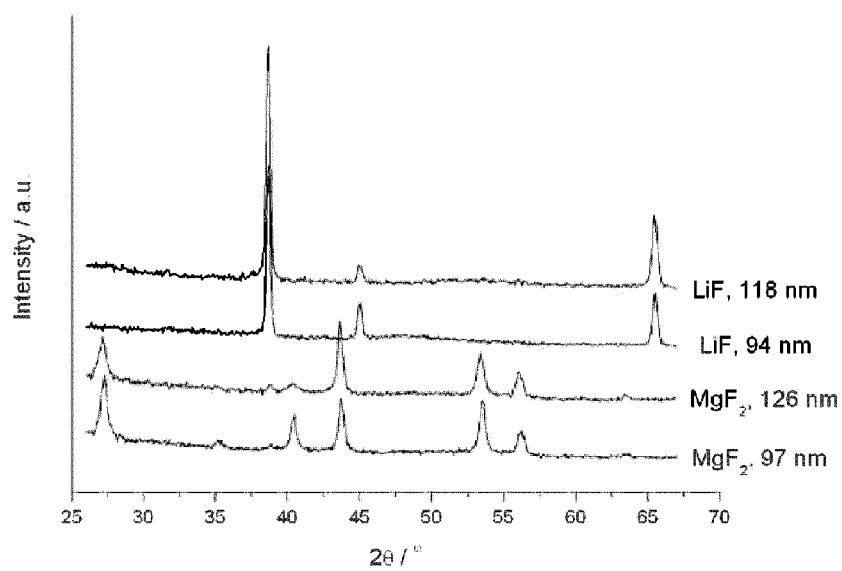
FIG. 19 illustrates X-ray diffractograms of some embodiments of $MgF_2$ thin films before and after Lithd exposure.

To probe the reaction mechanism further, MgF$_2$ films were first deposited onto Si(111) from Mg(thd)$_2$ and TiF$_4$. Lithd was then pulsed onto these fluoride films, one 97 nm and the other 126 nm in thickness, with a sequence of a 2-second Lithd pulse followed by a 4-second purge time at 325° C. This cycle was repeated 500 times. This experiment resulted in the formation of pure LiF films. The thinner MgF$_2$ film produced a LiF film that was about 94 nm thick, while the other MgF$_2$ film resulted in a LiF thin film having a thickness of about 118 nm. The GI-XRD measurements of these films (see FIG. 19) show no traces of crystalline MgF$_2$, and this result was further confirmed by EDX measurements, which indicated no magnesium present in the films. Similar tests were also done at lower temperatures. It was noted that with a sufficiently large Lithd dose, conversion can occur at about 275° C. for an approx. 150 nm thick MgF$_2$ film. At lower temperatures the reaction is even slower. These results suggest that the Li replacement reaction (see equation 2 above) is not limited to the surface layers but proceeds notably deep in the films. AFM measurements indicated that the original MgF$_2$ films had rms roughnesses of about 4.5 nm (97 nm film) and about 3.8 nm (126 nm film), and the LiF films generated from these had only slightly larger roughnesses of about 4.8 nm and about 4.1 nm, respectively. In addition, these films obtained by converting MgF$_2$ to LiF had better adhesion to the substrate than the films of similar thickness deposited directly: in the Scotch tape test, a film deposited with 1000 cycles of Mg(thd)$_2$+TiF$_4$+Lithd+TiF$_4$ peeled completely of the substrate, whereas the LiF film made from the 126 nm MgF$_2$ film showed only a few small adhesion failure areas.

Although certain embodiments and examples have been discussed, it will be understood by those skilled in the art that the scope of the claims extend beyond the specifically disclosed embodiments to other alternative embodiments and/or uses and obvious modifications and equivalents thereof.

We claim:

1. An atomic layer deposition (ALD) process for forming a thin film on a substrate in a reaction chamber, the process comprising:
   contacting the substrate with a vapor phase lithium precursor; and
   subsequently contacting the substrate with a separate vapor phase fluoride precursor,
   wherein the fluoride precursor reacts with a chemisorbed species of the lithium precursor on the substrate surface to form a lithium fluoride thin film.

2. The process of claim 1, wherein the lithium precursor comprises at least one of Lithd, lithium tert-butoxide, or lithium hexamethyldisilazane.

3. The process of claim 1, wherein the fluoride precursor comprises at least one of TiF$_4$, TaF$_5$, WF$_6$, MoF$_x$, F$_2$, HF, hexafluoroacetylacetone, organic fluorine compounds, or metalbetadiketonates comprising fluorine.

4. The process of claim 1,
   wherein the lithium precursor is chosen from the following: lithium 2,2,6,6-tetramethyl-3,5-heptanedionate, lithium tert-butoxide, and lithium hexamethyldisilazane; and
   wherein the fluoride precursor is chosen from the following: TiF4, TaF$_5$, WF$_6$, MoF$_x$, F$_2$, HF, hexafluoroacetylacetone, organic fluorine compounds, and metal betadiketones comprising fluorine.

5. The process of claim 1, wherein the ALD process comprises:
   contacting the substrate with the vapor phase lithium precursor such that at most a molecular monolayer of a chemisorbed species of the lithium precursor is formed on the substrate surface,
   removing excess lithium precursor,
   contacting the substrate with the vapor phase fluoride precursor, wherein the fluoride precursor reacts with the chemisorbed species of the lithium precursor on the substrate surface to form LiF;
   removing excess fluoride precursor, and
   repeating the contacting and purging steps until a lithium fluoride thin film of a desired thickness has been formed.

6. The process of claim 5, additionally comprising contacting the substrate with a calcium precursor or an oxygen precursor.

7. The process of claim 5, further comprising contacting the substrate with a magnesium precursor.

8. A vapor deposition process for forming a lithium fluoride thin film on a substrate in a reaction chamber, the process comprising:
forming a magnesium fluoride film; and
contacting the magnesium fluoride film with a lithium precursor;
wherein the magnesium fluoride film and lithium precursor react to form lithium fluoride thin film on a surface of the substrate.

9. The process of claim 8, wherein the lithium precursor comprises at least one of lithium 2,2,6,6-tetramethyl-3,5-heptanedionate, lithium tert-butoxide, and lithium hexamethyldisilazane.

10. The process of claim 8, wherein the magnesium fluoride film is formed by either chemical vapor deposition or atomic layer deposition.

11. An atomic layer deposition (ALD) process for forming a lithium fluoride thin film comprising a plurality of deposition cycles comprising:
contacting the substrate with a vapor phase intermediate precursor, such that at most a molecular monolayer of the intermediate precursor is formed on the substrate surface,
removing excess intermediate precursor;
contacting the substrate with a vapor phase fluoride precursor, wherein the fluoride precursor reacts with the intermediate precursor on the substrate surface to form an intermediate fluoride that does not comprise lithium;
removing excess fluoride precursor;
contacting the substrate with a vapor phase lithium precursor, such that at most a molecular monolayer of lithium fluoride is formed on the substrate surface; and
removing excess lithium precursor.

12. The process of claim 11, wherein the intermediate precursor is a magnesium precursor.

13. The process of claim 12, wherein the intermediate fluoride is magnesium fluoride.

14. The process of claim 11, wherein the fluoride precursor is selected from the group consisting of $TiF_4$, $TaF_5$, $WF_6$, $MoF_x$, $F_2$, HF, hexafluoroacetylacetone, and betadiketonates comprising fluorine.

15. The process of claim 11, wherein the lithium precursor is selected from the group consisting of lithium 2,2,6,6-tetramethyl-3,5-heptanedionate, lithium tert-butoxide, and lithium hexamethyldisilazane.

16. The process of claim 11, wherein the LiF film has a conformality of at least about 50% on structures having an aspect ratio of at least about 3.

* * * * *